United States Patent
Kazumi et al.

(10) Patent No.: US 6,919,274 B2
(45) Date of Patent: Jul. 19, 2005

(54) LSI DEVICE ETCHING METHOD AND APPARATUS THEREOF

(75) Inventors: Hideyuki Kazumi, Tokyo (JP); Tsuyoshi Yoshida, Kudamatsu (JP); Eiji Ikegami, Kudamatsu (JP); Kouichi Nakaune, Kudamatsu (JP); Masamichi Sakaguchi, Kudamatsu (JP); Yasuyuki Miyamoto, Kudamatsu (JP); Akihiro Sano, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/780,670

(22) Filed: Feb. 19, 2004

(65) Prior Publication Data

US 2005/0026431 A1 Feb. 3, 2005

(30) Foreign Application Priority Data

Jul. 30, 2003 (JP) .................................. 2003-203790

(51) Int. Cl.$^7$ ............................................. H01L 21/44
(52) U.S. Cl. ....................................... 438/687; 438/738
(58) Field of Search .............................. 438/687, 689, 438/913, 636, 643, 734, 735, 738, 700, 740, 471, 473, 474, 475, 706, 745

(56) References Cited

U.S. PATENT DOCUMENTS

| 6,617,244 B2 |   | 9/2003 | Nishizawa ................... 438/637 |
| 6,627,532 B1 | * | 9/2003 | Gaillard et al. .............. 438/623 |
| 6,777,325 B2 | * | 8/2004 | Ryuzaki et al. .............. 438/637 |
| 6,787,462 B2 | * | 9/2004 | Iijima et al. ................. 438/680 |

* cited by examiner

Primary Examiner—David Nhu
(74) Attorney, Agent, or Firm—Crowell & Moring LLP

(57) ABSTRACT

An apparatus for performing a plasma-etching of a LSI device including a Cu interconnection, a low-k film, and a diffusion prevention film has a treatment chamber, into which an etching gas is introduced, and a support table which is equipped with electrodes and on which said LSI device is placed. In this apparatus, the etching gasses are turned into plasma by supplying radio frequency power to electrodes provided within the treatment chamber, so that the LSI device is etched with ions of the plasma. In this apparatus, a sulfur-containing gas and a fluorine-containing gas are mixed to the etching gasses, so that the diffusion prevention film is selectively etched against the low-k film.

13 Claims, 6 Drawing Sheets

FIG. 2

| effect | protecting properties for the low-k film | etching properties against the diffusion prevention film | perpendicularity and controlling properties for the processed pattern | controlling properties for the density and temperature of plasma |
|---|---|---|---|---|
| large | $SO_2, SO_3, SOF_2$ | $NF_3, N_2F_4$ | $N_2, NH_3, NO_x$ | increase the electron temperature in the order of He, Ne, Ar, and Xe |
|  | $SO_2F_2, SON_x$ | $NF_3O$ | $N_2O$ |  |
|  | $SH_2$ | $SF_4, SF_6$ |  |  |
|  | $CO_2, CO, O_2$ |  |  | increase the density in the order of Xe, Ar, Ne, and He |
|  | $C_3O_2$ | $CF_4$ | $HCl, HBr, HF$ |  |
| small | $SiCl_4, SiBr_4$ |  | $HI$ |  |
|  | $C_xF_y (x/y > 1.5)$ | $HBr$ | $CHF_3, CH_2F_2$ |  | the binding energy between the surface and the product

| surface product | Si- (eV) | C- (eV) | O- (eV) |
|---|---|---|---|
| $CF_4$ | C:−0.04<br>F:1.01 | −0.29 | −0.05 |
| $CF_2$ | 2.71 | 3.01 | 3.30 |
| CO | 0.75 | 1.02 | 1.68 |
| $CO_2$ | C:−0.15<br>O:0.08 | 0.12<br>−0.51 | 0.68<br>0.79 |
| $COF_2$ | 0.2 | 0.22 | 0.56 |
| $SiF_4$ | −0.04 | −0.23 | 0.13 |
| $SiCl_4$ | −0.39 | −0.3 | 1.04 |
| $CCl_4$ | 1.73 | 1.09 | 1.20 |
| $SF_6$ | 1.37 | 1.89 | −0.39 |
| $SF_4$ | 2.74 | 2.74 | 3.10 |
| $NF_3$ | 3.52 | 1.46 | 0.95 |
| $SO_2$ | 0.95 | 1.16 | 1.96 |
| $N_2$ | −0.01 | −0.27 | −2.31 |

FIG.7 the binding energy between the surface (Si, C, O, N) and the product

| product | Si- (eV) | C- (eV) | O- (eV) | N- (eV) |
|---|---|---|---|---|
| $SO_2$ | 0.95 | 1.16 | 1.96 | |
| $CO_2$ | C:-0.07 | -0.33 | 0.69 | 0.54 |
| | C:0.28 | -0.78 | | |
| $SiF_4$ | -0.1 | -0.03 | -0.08 | 0.34 |
| $CF_4$ | C:-0.04 | -0.16 | -0.05 | -0.01 |
| | F:1.01 | | | |
| $COF_2$ | C:0.19 | 0.25 | 0.56 | 0.75 |
| | O:0.92 | -0.32 | | |
| CNF | C:1.49 | 1.93 | 2.34 | 2.12 |
| | N:1.84 | 1.21 | | |
| CNCl | C:1.18 | 1.53 | 1.73 | 1.68 |
| | N:1.52 | 0.93 | | |
| CNH | C:0.83 | 1.17 | 1.5 | 1.35 |
| | N:0.94 | 0.46 | | |
| CO | 0.81 | 1.07 | 1.68 | 1.75 |
| $CF_2$ | 2.71 | 3.1 | 3.29 | 3.26 |
| $SiF_2$ | 1.34 | 1.98 | 3.43 | 2.75 |
| $CCl_4$ | C:1.73 | 1.09 | 1.23 | 1.13 |
| | Cl:1.75 | | | |
| $SiF_2Cl_2$ | -0.08 | -0.29 | 0.74 | 0.49 |
| $SiCl_4$ | -0.39 | -0.4 | 1.04 | 0.24 |
| | Cl:0.04 | | | |
| $N_2$ | -0.01 | -0.27 | -2.31 | -0.68 |
| $NF_3$ | 3.89 | 1.28 | 0.39 | 0.93 |
| $SiF_2Br_2$ | -0.19 | 0.03 | 0.95 | 0.71 |
| $SiBr_4$ | -0.25 | 0.28 | 1.65 | 0.49 |

LSI DEVICE ETCHING METHOD AND APPARATUS THEREOF

BACKGROUND OF THE INVENTION

1. Field of the Invention

The present invention relates to an LSI device etching method and apparatus for treating LSI devices by making use of plasma.

2. Description of Relevant Art

With the rapid advancement in finer sizes and higher integration, LSI devices with a gate length of 0.13 μm have been shifted to mass production, and LSI devices with sizes of 90 or 65 nm are being developed. For high speed operation of LSI devices, it is necessary to achieve an improvement in the operation speed of the transistors and to overcome the propagation delay (so-called RC delay) of multilayer metal interconnection. In recent years, the propagation delay of interconnection is becoming more and more influential.

As a solution means, Cu interconnection having a low resistivity ρ and a low-k film having a low relative permittivity k of the capacitor part are being developed. Since $CuCl_x$, a chloride of Cu, is low in steam pressure, plating technique or the like have been generally used for formation of the Cu interconnection. In recent years, the technique, such as Dual Damascene method, by which an interconnection and a via-part are simultaneously formed in order to provide a multilayer interconnection structure, has been developed. As the low-k film, such films as HSQ (Hydrogen Silsequioxane), MSQ (Methyl Silsequioxane), polysiloxane and others are being developed to achieve relative permittivity k<3.0. In addition, a porous insulator film having pores inside is also now being used.

In the multilayer interconnection structure having a combination of Cu interconnection and a low-k film of the damascene structure, it is necessary to provide a diffusion prevention film to suppress the diffusion of Cu. The diffusion prevention film can be SiN, SiON, SiC, SiOC, SiCN, or the like. Cu easily diffuses into Si (Poly-Si, intrinsic Si, amorphous Si, or SiC in parts) composing transistors or into a capacitor $SiO_2$ (low-k film). When Cu diffuses into Si, it affects the band gap of Si and causes a fluctuation in electric properties. Thus, when Cu diffuses into the low-k film, Cu becomes the seed of polarization, whereby the relative permittivity increases. This is why the presence of the diffusion prevention film is important.

When forming a low-k film onto Cu interconnection, in the multilayer interconnection structure, there are various combinations between the type and structure of the diffusion prevention film and the low-k film. As one example, the multilayer interconnection structure, in which a first low-k film, a Cu interconnection, a diffusion prevention film, and a second low-k film are formed in this order, can be cited. Here, first and second low-k films are often made of the same material. In general, the diffusion prevention film has a higher dielectric constant than the low-k film, therefore the diffusion prevention film is preferably thinner.

When etching is conducted to form a contact hole for providing an interconnection in this diffusion prevention film, it is necessary to have a large etching selectivity between the diffusion prevention film and the low-k film. That is, it is necessary one of the diffusion prevention film and the low-k film is selectively etched. In this occasion, the diffusion prevention film also functions as an etching stopper film.

These descriptions regard to the case of the etching of the film having the damascene structure including Cu interconnection and a low-k film. In the case of the etching of the Si-containing mask material, it is also necessary to increase the etching selectivity between the mask material and the underlying film (the resist or the low-k film).

In Japanese Unexamined Patent Publication 2002-110644 (equivalent to U.S. Pat. No. 6,617,244), a method for performing the etching of the multilayer interconnection structure, which includes an underlying interconnection layer, a SiC layer provided thereon, an interlayer insulator film layer, a via-hole, and an interconnection trench, is disclosed. In this method, a nitrogen-containing gas is added to a halogen compound-containing etching gas in order to perform the dry-etching of the SiC layer, during etching a multilayer interconnection structure. In this method, $NF_3$, $SF_6$, $CF_4$, $CHF_3$, $CH_2F_2$, oxygen, nitrogen, ammonium, and nitrous oxide are used as examples of the gas to be mixed to the etching gas.

In Japanese Unexamined Patent Publication H07-169747, for example, a method for etching $SiO_2$ film is disclosed. In this method, a mixture of a chlorofluorocarbon-based gas and a sulfur-based gas not containing fluorine, such as SO, $SO_2$, $SO_3$ and others, are used.

In case of Japanese Unexamined Patent Publication 2002-110644, the gases, such as $NF_3$ or $CF_4$, are used for etching SiC. In this case, although SiC can be etched at a high speed when $NF_3$ is used solely, the etching selectivity of SiC to the interlayer insulator film typified by SiOC, which should not be etched, is as low as 2 or so. This selectivity can be obtained in the case of $CF_4$, and can be improved by increasing the amount of $O_2$ gas to be added.

In this case, however, the etching speed of SiC, which is the film to be etched, decreases monotonously. Even if the etching rate is sacrificed and set to a level not more than 100 nm/min, the etching selectivity cannot be higher than 4.

In the case of Japanese Unexamined Patent Publication H07-169747, the film to be processed is $SiO_2$, and there are no considerations of etching of SiC and achieving a high etching selectivity of SiC to SiOC.

Therefore, an etching process and apparatus which, during etching a multilayer interconnection structure (damascene structure), can increase the etching selectivity (preferably 8 or larger) of the diffusion prevention film (etching stop film) to the low-k film and also increase the etching speed (200 nm/min or higher) of the diffusion prevention film, have been required.

Additionally, an etching process and apparatus which, during etching a mask material, can increase the etching selectivity of the mask material to the underlying film (the resist or the low-k film) or increase the etching speed of the mask material, have been required.

SUMMARY OF THE INVENTION

The present invention relates to an LSI device etching method for subjecting an LSI device to a plasma etching. The LSI device to be etched includes Cu interconnection, a low-k film, and a diffusion prevention film containing silicon (Si) for preventing diffusion of Cu into the low-k film. The LSI device etching method includes the step of: selectively etching the diffusion prevention film against the low-k film, by use of a gas containing sulfur (S) as an etching gas.

The diffusion prevention film is composed of SiC, SiCN, SiO, SiOC, SiN or the like, and the low-k film is composed of SiOC, SiON or the like. The etching gas can be $SO_2$, $SO_3$, $SOF_2$, $SO_2F_2$, $SON_x$, $SON_xF_y$, or $SH_2$.

Furthermore, it is preferable that a gas containing N and F is mixed with the etching gas. $NF_3$, $NF_3O$, or $N_2F_4$ is used for a gas containing N and F.

This composition can increase the protecting properties for the low-k film and also improve the etching selectivity of the diffusion prevention film to the low-k film.

The present invention relates to an LSI device etching method for subjecting an LSI device to a plasma etching. The LSI device to be etched includes a silicon (Si)-containing mask material and any of an underlying low-k film and a resist. The LSI device etching method comprising the step of: selectively etching the mask material against any of the underlying low-k film and the resist, by use of gas containing sulfur (S) as an etching gas. The mask material can be SiC, SiCN, $Si_3N_4$, or SiON.

A carbon (C)-containing gas such as $CO_2$, CO, $C_3O_2$, $O_2$, CNF, CNCl, or CNH is added to the etching gas of the first and second aspects of the invention. This additive gas increases the protection properties for the low-k film even when $NF_3$ having high etching properties against the diffusion prevention film or the mask material is used, thereby the etching selectivity and the processed pattern can be controlled.

A nitrogen (N)-containing gas such as $N_2$, $NH_3$, or $NO_x$ ($NO_2$, $N_2O$ or the like) is added to the etching gas. This additive gas generates a reaction product having negative binding energy, whereby the amount of product difficult to adhere can be regulated so as to control the processed pattern.

It is also possible that a gas containing hydrogen (H) and halogen such as $H_2$, hydrogen halide, or $NH_3$ is added to the etching gas. This additive gas generates a reaction product which has a negative binding energy with the surface and which is difficult to adhere to the respective side walls of trenches and holes, whereby the trenches and holes can be processed perpendicularly.

It is also possible that a rare gas such as He, Ne, Ar, or Xe is added as the carrier gas into the etching gas. This carrier gas can change plasma density, electron temperature, and the ratio of dissociation in the vapor phase, whereby the protecting properties and the etching properties can be controlled.

It is also possible that a fluorocarbon $C_xF_y$ containing C and F is added to the etching gas. The ratio of x to y should be not less than 1 for effective protecting properties and not less than 0.5 for effective etching properties, and such an additive gas can be namely $CF_4$, $C_2F_6$, $C_3F_8$, $C_4F_8$, $C_5F_8$, $C_4F_6$, $C_6F_6$ or the like.

The present invention relates to a LSI device etching apparatus for subjecting an LSI device to a plasma etching. The LSI device has Cu interconnection, a low-k film and a diffusion prevention film. The LSI device etching apparatus includes a plasma treatment apparatus which changes an etching gas into plasma and applies high frequency power to an electrode to thereby etch the LSI device by utilizing ions in the plasma, the plasma treatment apparatus having a treatment chamber being provided with a support table in which the electrode is provided and on which the LSI device is to be placed, the etching gas being introduced into the treatment chamber. In this apparatus, a mixture of a sulfur (S)-containing gas and a nitrogen (N)-and-fluorine (F)-containing gas is used as the etching gas in the step of selectively etching the diffusion prevention film against the low-k film.

Furthermore, the plasma treatment apparatus is characterized by being equipped with a temperature control means for changing the temperature of the support table in an attempt to change an adhesion rate of a radial and reaction product. The temperature can be set in a range of −40 to 100° C. (preferably 40 to 60° C.) to change the amount of deposition onto SiOC, or the amount of deposition onto/the amount of chemical etching against the side walls of SiC.

According to the present invention, when a combination of the diffusion prevention film and the low-k film is etched, a gas having high protecting properties for the low-k film and high etching properties against the diffusion prevention film is used. This realizes etching at a high rate in a high etching selectivity.

The pattern control is realized by adding a gas having low adhering properties onto each film (a gas generating a product which has a negative binding energy with the surface and which is difficult to adhere to the respective side walls of trenches and holes).

The addition of another adhesive gas (a rare gas such as He, Ne, Ar, or Xe) can change the degree of dissociation and the composition ratio (between radical and ion), so as to control the etching selectivity, etching rate, and pattern, thereby realizing a desired process.

BRIEF DESCRIPTION OF THE DRAWINGS

FIG. 2 is a table showing the gas components and their combinations can be used in the present invention.

FIG. 7 is a table explaining the binding energy between each surface (Si-surface, C-surface, O-surface, and N-surface) and each product.

DESCRIPTION OF THE PREFERRED EMBODIMENT

The embodiments of the present invention will be described as follows. In an attempt to reduce the interconnection delay to make the operation speed of an LSI device faster, a structure having a combination of copper interconnection and a low-k film has been considered. The low-k film has a porous structure (the film has pores of nanometer (nm) size) because of the necessity for decreasing the dielectric constant. Therefore, it is necessary to provide a diffusion prevention film in order to prevent the occurrence of a copper diffusion.

Figure 3:
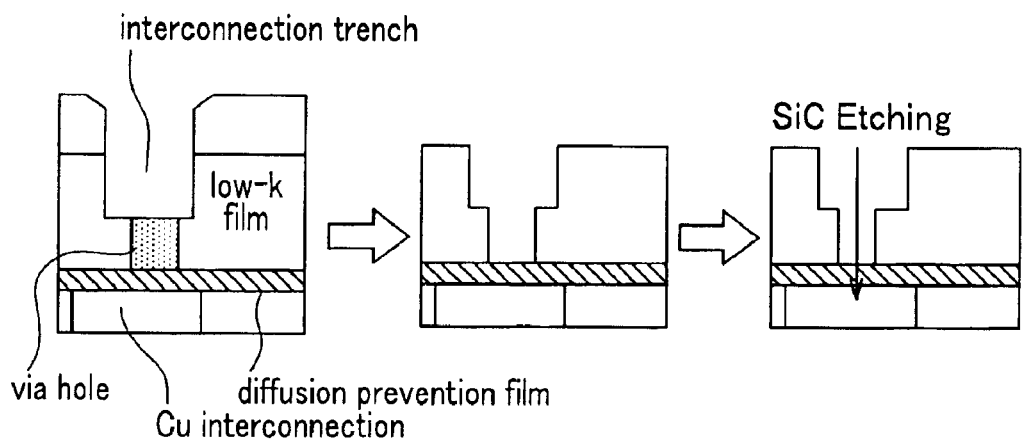
FIG. 3 is an explanatory view showing the etching steps of the LSI device, which includes the Cu interconnection, a diffusion prevention film, and a low-k film.

FIG. 3 shows cross sectional views of the structure of the LSI device. The LSI device is provided with an interconnection trench and a via-hole while leaving the low-k film (SiOC) for the contact with the underlying electrodes (Cu interconnection). To provide this structure, the diffusion prevention film (SiC) is etched after providing the interconnection trench and the via-hole in the order of illustrated processes. When performing the etching (a SiC Etching in FIG. 3), it is necessary to have a high etching selectivity of the diffusion prevention film (etching stop film) against the low-k film and to increase the etching speed of the diffusion prevention film. That is, it is required that the diffusion prevention film is selectively etched against the low-k film and that the etching speed of the diffusion prevention film is higher than the low-k film.

Figure 1:
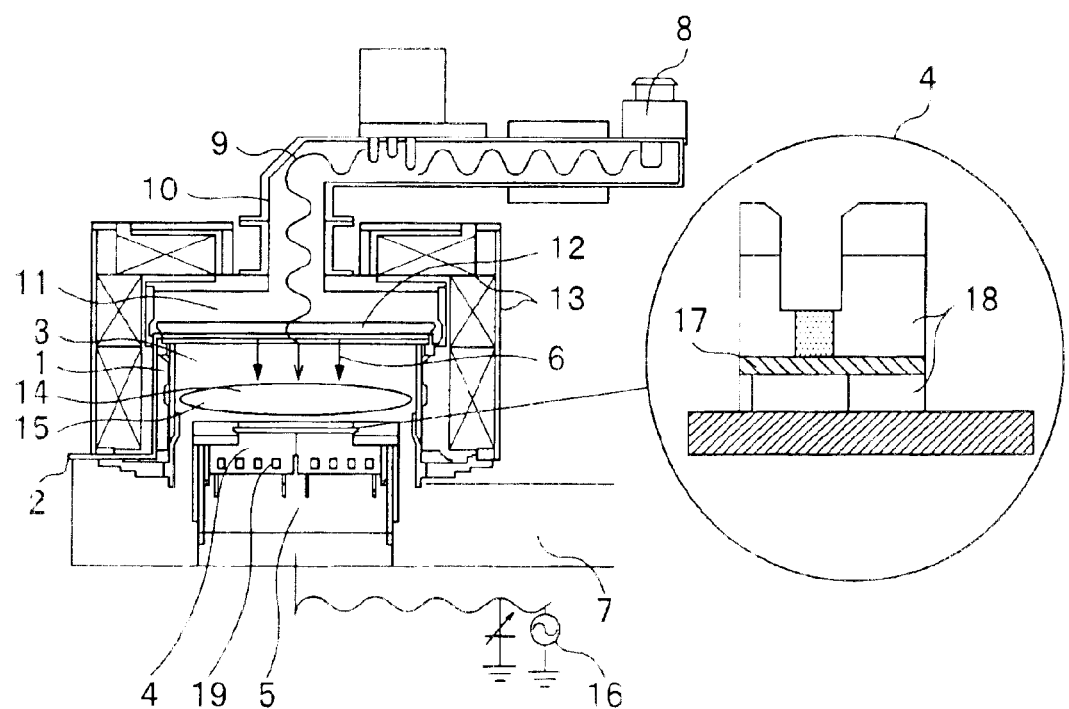
FIG. 1 is an explanatory view showing the construction of the plasma treatment apparatus.

FIG. 1 is an explanatory view showing a construction of the plasma treatment apparatus according to the present invention. The apparatus has a vacuum container 1 including a treatment chamber 3 into which gas 6 is introduced through a gas introduction system 2, and a support table 5 equipped with electrodes for supporting a wafer 4. The gas in the treatment chamber 3 is exhausted through an exhaust system 7. The microwave 9 generated in a microwave generator 8 is guided to a hollow part 11 surrounded by metal walls through a waveguide 10. Then, the microwave is further guided to the treatment chamber 3 via an introduction window 12. A shower plate for gas supply is disposed under the introduction window 12. A magnet and a coil 13, generating a magnetic field of approximately 1K Gauss, are provided outside the treatment chamber 3. The gas 6 guided into the treatment chamber 3 is ionized or dissociated by the interaction of the microwave electric field and the magnetic field so as to generate plasma 14 or radical 15.

The gas 6 must be able to be used for the etching of a combination of the diffusion prevention film and the low-k film (SiC and SiOC, for example) in a high etching selectivity and at a high speed. That is, the gas that selectively etches the target film from between the diffusion prevention film (SiC) and the low-k film (SiOC) at a high speed is adopted in this invention. In this apparatus, the gas 6 is turned into plasma for performing the etching.

Selection of the Gas

Here, the etching selectivity and etching speed change greatly depending on components of the gas 6. Therefore, guidelines for the selection of gas components will be described first.

The gases to be used for etching are selected based on the amount of the binding energy between the surface and a radical or reaction product. Here, the surface is the reaction surface to be processed by etching.

Figures 5, 6:
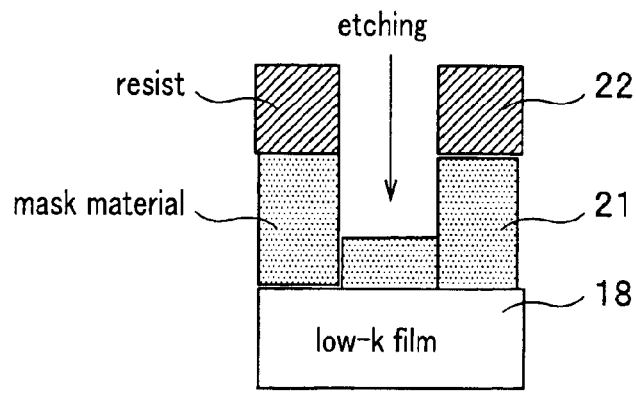
FIG. 5 is a sectional view showing of the device according to the second embodiment.
FIG. 6 is a table explaining the binding energy between each surface (Si-surface, C-surface, and O-surface) and corresponding product.

FIG. 6 shows binding energy between each surface and each product. FIG. 7 shows binding energy between each surface including N components and each product.

Gas used as the etching gas should have high protecting properties against the underlying film (the low-k film or the resist), and high etching properties against the diffusion prevention film or the mask film.

The wording "protecting properties" indicates the degree of protecting a film against ions coming from plasma, by the deposition of gas, its radical, and etching product onto the film. That is, if the protecting property is high, it means that the surface is highly resistant to the reaction with ions. This is because the gases, radicals generated from the gas, and etching products protect the surface from reacting with ions.

On the other hand, the wording "etching properties" indicates the degree of the ease of evaporation of species which is obtained by the binding of the surface and gas or radicals etc. Here, this evaporation occurs if the binding energy between the film and the gas or its radical of the species is higher than the binding energy between components of the film.

In the present invention, these guidelines have been established by evaluating the binding energy between the film and gas or a radical using the molecular orbital method.

Here, this evaluation is performed using a substrate, in which SiC is used as the diffusion prevention film and SiOC is used as the low-k film of an underlying film, for measuring the binding energy. In this embodiment, the binding energy between the dangling bond exposed on the surface and gas, or the binding energy between the dangling bond and radical have been examined using a cluster composed of Si and C and other clusters composed of Si, O and C.

In FIG. 6, the vertical column shows the types of gases and reaction products, and the binding energy is expressed in the unit of eV. The symbol Si— indicates that the surface is Si and a dangling bond exists on the surface. However, radicals of F—, O—, and $CF_3$, each of which has a dangling bond, are not shown in this figure. This is because almost all of them bond with the dangling bond of themselves.

As an indicator for judging protecting properties for SiOC, it is important to be able to easily adhere to the O-surface. That is, it is important having a high binding energy with O.

When a following formula is considered as an indicator of the etching selectivity between SiC and SiOC, following data are obtained from data of FIG. 6.

$\Delta E$(SiOC)=(binding energy with O-surface)−(binding energy with C-surface)

$\Delta E$(SiOC) of $SO_2$ is 0.80 eV, $\Delta E$(SiOC) of CO is 0.66 eV, $\Delta E$(SiOC) of $CO_2$ is 0.56 eV, $\Delta E$(SiOC) of $SF_4$ is 0.36 eV, and $\Delta E$(SiOC) of $CF_2$ is 0.29 eV.

As can be seen from these values, it is recognized that $SO_2$ has the highest value.

On the other hand, as an indicator for judging etching properties for SiC, it is important to be able to easily adhere to the C-surface. To be more precise, it is preferable to use a gas, which adheres to Si-surface and which generates a product that does not easily adhere to the Si-surface.

For example, as for $CF_4$, $CF_4$ does not adhere to any of Si-surface, C-surface, or O-surface; however, $CF_2$, which is generated from $CF_4$ by the dissociation with plasma, adheres to any of these surfaces. On the other hand, as for $SF_6$, $SF_6$ adheres to the Si-surface or C-surface but does not adhere to the O-surface.

By taking these into consideration, an indicator of the etching properties against SiC is defined as the following formula.

$\Delta E$(SiC)=(binding energy with Si-surface)−(binding energy with O-surface).

Following data are obtained from this formula using data of FIG. 6.

$\Delta E$(SiC) of $SF_6$ is 1.37 eV (here, negative values are regarded as 0), $\Delta E$(SiC) of $CF_4$ is 0 eV, and $\Delta E$(SiC) of $NF_3$ is 2.57 eV. From this computing result, it is recognized that $NF_3$ adheres to Si-surface extremely easily.

Next, etching, while changing the etching gas, of an LSI device having the combination of SiC and SiOC is performed using a plasma treatment apparatus which utilizes 2.45 GHz of a microwave and magnetic field.

Figure 8:
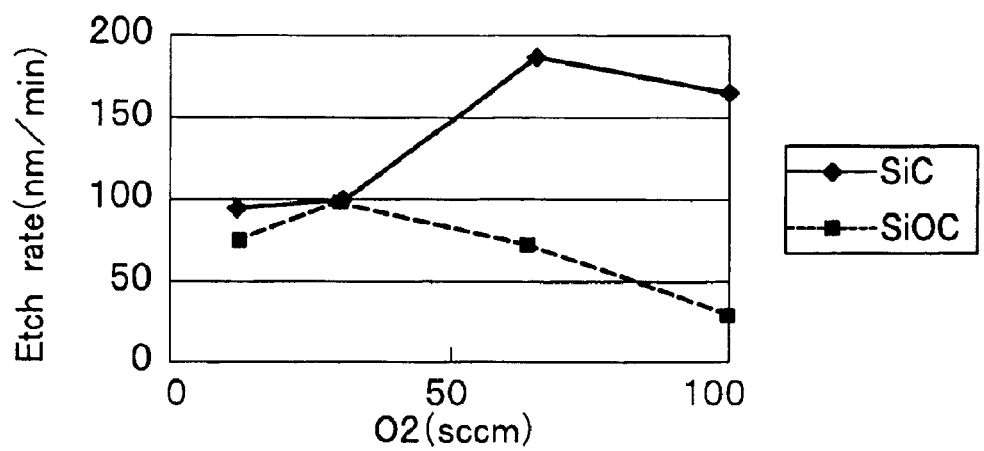
FIG. 8 is a graph showing the etching results with the conventionally used gas containing $CF_4$ and $O_2$.

FIG. 8 shows the etching results performed using mixture gas containing $CF_4$ and $O_2$ that is used in the conventional etching. As can be seen from FIG. 8, the etching rate of SiOC decreases as the flow rate of $O_2$ increases. On the contrary, the etching rate of SiC increases until the flow rate of $O_2$ reaches at a certain point, and then etching rate of SiC begins to decrease. These results will be explained based on the sizes (amounts) of the binding energies.

When the mixture gas containing $CF_4$ and $O_2$ is used, a gas of $CF_4$, and radicals of $CF_3$, $CF_2$, F, and O exist in the vapor phase, and $SiF_4$, $SiF_2$, and $COF_2$ exist as a product. Since binding energy between $CF_4$ and Si-surface is −0.04 eV (see FIG. 6), $CF_4$ is difficult to adhere to the Si-surface. $CF_4$ does not adhere to the C-surface or O-surface, either, because of the same reasons (see FIG. 6). On the other hand, CF2 adheres to Si-surface, C-surface, and O-surface, and is deposited on them.

Additionally, as for $COF_2$, $COF_2$, which is one of reaction products that is generated when SiC or SiOC is etched with a gas containing F and O, adheres to Si-surface, C-surface, and O-surface, and is deposited on them. This is because the binding energy between $COF_2$ and Si-surface is 0.2 eV (see FIG. 6) the binding energy between $COF_2$ and C-surface is 0.22 eV (see FIG. 6), and the binding energy between $COF_2$ and O-surface is 0.56 eV (see FIG. 6). That is, since the binding energy between $COF_2$ and O-surface is high, $COF_2$ more easily adheres to the O-surface than Si-surface or C-surface.

Thus, if $CF_2$ adheres to the O-surface, $CF_2$ is changed into $COF_2$ on the O-surface due to its high binding energy with O-surface (3.30 eV (see FIG. 6). Thus, $COF_2$ is evaporated from the O-surface and is removed.

In this occasion, since numbers of dangling bonds of the O-surface are reduced due to the binding with $CF_2$, adhesion of F to the O-surface is disturbed. Thereby, the progress of etching of O-surface is stopped.

As for SiOC, F and $CF_2$ adhere thereon, and Si turns into $SiF_4$, C turns into $CF_4$ or $COF_2$, and O turns into $COF_2$ due to the bonding between O and $CF_2$. Then, $SiF_4$ and $COF_2$ are evaporated and are removed. Consequently, with an increase in the flow rate of $O_2$, the etching rate of SiC once increases and then starts to decrease when the flow rate of $O_2$ reaches at a certain point. In addition, as can be seen from FIG. 8, O tends to protect the SiOC surface rather than the SiC surface. This phenomenon has something to do with the decreasing of the etching rate of SiOC that arises in accordance with the increasing of the flow rate of $O_2$ gas which supplies O.

As an example of gas, which has a protecting property and meets the requirement that the binding energy with O-surface is higher than the binding energy with Si-surface or C-surface, $CO_2$ shown in FIG. 6 can be cited. On the other hand, $SF_6$ which is the typical gas containing F is easily bound with the Si-surface and C-surface and never adheres to the O-surface. But, $SF_4$, radical of $SF_6$, adheres to any of these surfaces.

Figure 9:
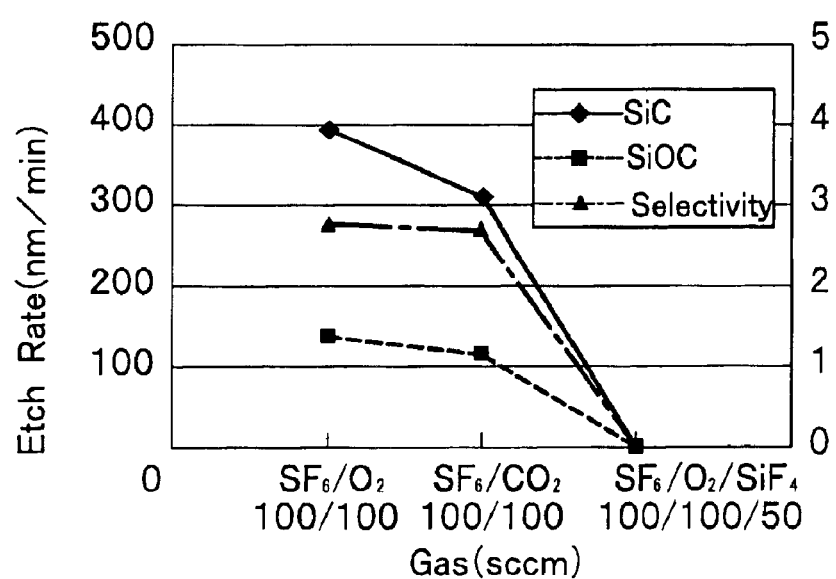
FIG. 9 is a graph showing the etching results with the conventionally used gas $SF_6$.

FIG. 9 shows the etching results performed using $SF_6$ that is adopted in a conventional etching. The gas containing $SF_6$ and $O_2$ has a higher etching rate against SiC than the gas containing $CF_4$ and $O_2$ mentioned earlier (FIG. 8). This result is connected with the difference in the value of $\Delta E$ (SiC). This indicates that, in the case of $SF_6$, not only F in the vapor phase but also $SF_6$ directly adheres to the Si-surface, C-surface, or O-surface and gives F to them (surface). This phenomenon is different from the case of $CF_4$. Here, if $CO_2$ is used instead of O (Oxygen), the etching rates of SiC and SiOC both decrease.

Judging from the aforementioned results of conventional etching, a high etching selectivity of SiC to SiOC and their high etching rates can be realized by supplying gas or a radical which has strong protecting properties for SiOC and strong etching properties against SiC. That is, it is recognized that gas or radical that has a strong protecting property against SiOC and has a strong etching property against SiC are required for achieving selective etching of SiC at a high rate.

In this case, the indicator for judging the protecting property can be defined by a following formula.

$$\Delta E(\text{SiOC})=(\text{binding energy with O-surface})-(\text{binding energy with C-surface}) \quad (1)$$

The indicator for judging the etching properties can be defined by a following formula.

$$\Delta E(\text{SiC})=(\text{binding energy with Si-surface})-(\text{binding energy with O-surface}) \quad (2)$$

The accuracy of the pattern formed by etching is affected by the amount of reaction products that adhere to the side-wall of the pattern. Here, the value obtained from formula (1) has an influence on the increasing of the thickness of the pattern, and the value obtained from formula (2) has an influence on the decreasing of the thickness of the pattern.

However, achieving a balance between the etching of SiC and the deposition of the product is required in order to form the vertical side-wall on the etched region (see FIG. 3). But, since the etching condition has to be controlled severely for achieving a balance, the provision of the vertical wall is quite difficult.

Yet, it is easy to generate or add gas which resists adhering to adhere to the side walls. In other words, if the binding energy is negative, nothing adheres to the side wall. Therefore, selecting gas to meet this requirement is only required for achieving the balance. Of the gases shown in FIG. 6, $N_2$ corresponds to it.

Based on these indicators, gases are selected in consideration of adhering properties against the low-k film, protecting properties for the low-k film, etching properties against the diffusion prevention film, etching selectivity, and controlling properties for the processed pattern.

(Adhering Properties Against the Low-k Film)

Gas or the radical generated from the gas (etching gas) must be deposited onto SiOC to protect it.

In this case, a gas that easily adheres to Si-surface, C-surface and O-surface and that easily performs the etching of SiC should be selected. That is, the gas, which generates a radical or a reaction product whose binding energy with O-surface is higher than the binding energy with Si-surface or C-surface, should be selected.

In the present embodiment, the following formula is defined as an indicator, and one having a large value of $\Delta E$ is selected.

$$\Delta E(\text{SiOC})=(\text{binding energy with O-surface})-(\text{binding energy with C-surface})$$

For example, as shown in FIG. 6, CO, $CO_2$, $COF_2$, $SiF_4$, $SiCl_4$, $SF_4$, $SO_2$, and others can be adoptable. Additionally, $SOF_2$ and NOF also satisfy this requirement although they are not on the list.

FIG. 2 shows gas components, which selectively etch SiC at a high etching rate. In this drawing, gas components are listed in decreasing order of effects in terms of the protecting properties for the low-k film, the etching properties against the diffusion prevention film, and other properties. As other examples of gases having high adhering (protecting) properties to the low-k film, gasses such as $SO_2$, $SO_3$, $CO_2$, CO, $C_3O_2$, and fluorocarbon CxFy can be cited.

(Protecting Properties for the Low-k Film)

Of the aforementioned gases and radicals, molecules having a high depositing property, such as open shell molecules, molecules having a spin, and molecules having polarity, can provide a protecting property. This is because these molecules can be deposited continuously, thereby strengthening the protecting properties. The gases or radicals of this type include: $CO(CO_2)$, $SO_2$, $SO_3$, and $SOF_2$. Among them, $SO_2$ has the largest $\Delta E(\text{SiOC})$.

On the other hand, $SiF_4$, $SiCl_4$, $SiCl_xF_yBr_z$ (x, y, z are coefficient) and the like have poor protecting effects (properties). Besides, O-surface tends to react with $CF_2$ and to be evaporated in the form of $COF_2$. Therefore, it is necessary that the proportion of F in $C_xF_y$ is small and that the ratio of y to x is smaller than 2 (y/x<2).

(Etching Properties Against the Diffusion Prevention Film)

Gases and radicals that adhere to Si-surface and C-surface and that are evaporated together with these surfaces have to be selected, in order to etch Si-surface and C-surface. For attaining these requirements, gases and radicals having a large value of $\Delta E(SiOC)$ have to be selected. Here, $\Delta E(SiOC)$ is defined as a following formula.

$$\Delta E(SiOC) = (\text{binding energy with O-surface}) - (\text{binding energy with C-surface})$$

This requirement is satisfied by F, Cl, Br, NF, $NF_2$, $CF_x$ (x=2, 3), and $SO_x$.

When performing etching in the presence of O (Oxygen), the evaporation of the surface is disturbed due to the formation of $SiO_x$, which is hard to evaporate. However, in the case of CO, SO, NO and the like, even if O (Oxygen) is present, C, S, and N can adhere to the Si-surface and C-surface. Thereby, evaporation of the surface can be facilitated.

Gases having high etching properties against the diffusion prevention film include: $SF_6$, $NF_3$, $CF_4$, $C_2F_6$, $C_xF_y$ (the ratio of y to x is not less than 2 (2<y/x)), $Cl_2$, HF, HCl, and HBr. In general, a gas containing F, C and N can be used to etch SiC. Preferably, $NF_3$ or an $NF_x$ halogen compound in which F is substituted with another halogen element can be used.

(Etching Selectivity)

As the measure of the gas which suppresses the etching of SiOC and facilitates the etching of SiC, the gas having a large value of $\Delta E(SiOC)$ should be selected. This type of gas includes: $SO_2$, $SO_3$, and CO.

As the measure of the gas having etching properties against SiC, the gas, which has a large value of $\Delta E(SiC)$ and which generates radicals or product having a large value of $\Delta E(SiC)$, should be selected. This type of gas includes: $NF_3$, $SF_6$, $SF_4$, $CF_4$, and $C_xF_y$ (the ratio of y to x is not less than 2 (2≦y/x)). Consequently, mixing a gas having a large $\Delta E(SiOC)$ and a gas having a large $\Delta E(SiC)$ can make the etching selectivity large.

(Controlling Properties for the Processed Pattern)

In order to control the processed pattern, particularly the patterns of holes and trenches on LSI device, it is only necessary to control the amount of gas, radical, and reaction product (hereinafter these are also indicated as "reaction species") that fulfill the following requirement (b) or (c) in addition to the requirement (a). (a) Reaction species adhere to the surface and cause chemical etching (decrease the thickness of side walls of holes and trenches); (b) Reaction species adhere to the surface and are deposited thereon (increase the thickness of side walls of holes and trenches); and (c) Reaction species are difficult to adhere to the surface (do not change the thickness of side walls of holes and trenches).

Since almost all of the radicals and reaction products satisfy the requirement (b), gases which meet the requirements (a) and (c) will be mentioned as follows.

In the case of SiC, the requirement (a) can be satisfied by the gas which has a positive binding energy with Si or C, and which generates reaction species whose binding energy with Si or C is larger than the binding energy between Si and C. As an example of this kind of gas, for example, gases of $SO_2$ and $SO_3$ can be cited.

Additionally, the requirement (c) can be satisfied by the gas which generates a radical or reaction product ($SiCl_4$, $SiF_2Br_2$, $N_2$, or $CF_4$) that possesses negative binding energy with Si or that possesses quite small binding energy with Si. For example, gases of $N_2$, $N_2O$, $NF_3$, $C_xF_y$ (the ratio of y to x is not less than 2 (2≦y/x)) can be cited.

Consequently, as the gas that can control the accuracy of the etched pattern, a gas having minus or small binding energy with various kinds of surfaces is selected. As can be seen from FIG. 6 and FIG. 7, the gasses of $SiF_4$, $N_2$, $CO_2$, $SiF_xCl_yBr_z$ (x, y, z=0–4) can be adoptable.

As the gas to generate these gases, N-containing gases such as $NF_3$, $N_2$, $NH_3$ and others, $Cl_2$, HCl, HBr, HF, or HI shown in FIG. 2 can be used.

As described above, in order to realize the protecting properties for SiOC, that is, a high etching selectivity of SiC against SiOC, a gas having large $\Delta E(SiOC)$ is required, and an S-containing gas such as $SO_2$ or $SO_3$ can be used. It is also possible to use SO, $SOF_2$, $S_2O_3$, $SO_2F_2$, $SON_x$, $SON_xF_y$, $SH_2$ or the like.

In order to etch SiC at a high speed, a gas having large $\Delta E(SiC)$, such as $NF_3$ gas, is required. $NF_3$ gas adheres to the surface more easily than $CF_4$ or $SF_6$, and facilitates the etching of SiC. As a result, for example, the use of $SO_2$ and $NF_3$ in mixture can realize both a high etching selectivity and a high etching rate.

Controlling the amount of F in the vapor phase can change the etching rate and the etching selectivity within a certain range. As the gas for controlling the amount of F, Hydrogen-containing gases, such as $H_2$, a hydrogen halide, $NH_3$ or the like can be adoptable.

If a rare gas, such as He, Ne, Ar, Xe or the like are mixed, the plasma density, electron temperature, and the ratio of dissociation in the vapor phase can be changed, whereby controlling the amount and types of radical is allowed. The use of these gases can control the protecting properties and the etching properties.

The aforementioned example was explained with regard to the LSI device having a combination of SiC and SiOC. The combination of the diffusion prevention film (stop film) and the low-k film can be: SiC and SiON; SiCN and SiOC; and SiCN and SiON. The binding energy between the N-surface and the aforementioned gas is approximately between the binding energy with the Si-surface or C-surface and the binding energy with the O-surface, therefore the same arguments about adhering properties, protecting properties, and etching properties hold true.

The examples of the plasma etching apparatus using the aforementioned gases will be described as follows.

EXAMPLE 1

A first example of the present invention will be described with reference to the plasma treatment apparatus shown in FIG. 1 and the LSI device structure shown in FIG. 3.

FIG. 3 shows the LSI device structure of an object to be processed, which includes: an underlying interconnection layer (Cu interconnection); a diffusion prevention layer (SiC) formed on the underlying interconnection layer; a low-k film (SiOC) served as an interlayer insulator film layer; a via hole; and an interconnection trench.

This multilayer interconnection structure (damascene structure) will be supplied using a plasma-etching technique.

In this example, SiOC is used for the low-k film, but SiOR (R: $C_xF_y$ wherein x and y are integers), SiON or the like can be used instead of SiOC. Additionally, SiC is used for the diffusion prevention layer, but SiR (R: $C_xF_y$ wherein x and y are integers), SiCN or the like can be used instead of SiC.

The plasma treatment apparatus etches the object composing SiC and SiOC by using 2.45 GHz of a microwave and magnetic field in the following procedures.

A wafer 4 is disposed on a support table 5, and a radio frequency is applied from a radio frequency power supply 16 connected thereto. Here, since a diffusion prevention film (etch stop film) 17 and a low-k film 18 (see the circle in FIG. 1) are formed on the wafer 4, ions in the plasma is guided to the wafer due to the radio frequency applied across the electrodes on the support table 5. Thereby, the etching of the object is achieved.

In the present embodiment, the etching apparatus that utilizes the microwave and magnetic field has been explained. But, other types of apparatus can be adoptable as long as a plasma generation system is used.

For example, an apparatus, in which an upper electrode and a lower electrode are placed in parallel in a vacuum container, can be adoptable. In this apparatus, etching of object is performed by applying a radio frequency to at least one of the upper electrode and the lower electrode.

Additionally, a magnetron apparatus, which has the same constructions as above-described apparatus and is equipped with magnetic coil or magnet, can be adoptable. It is also possible to use an inductively coupled apparatus in which RF is applied onto a vacuum container composed of a dielectric and a coiled antenna. In addition, these apparatuses can be used with a frequency in the VHF or UHF band.

In this embodiment, the gas 6 is turned into plasma for etching. A sulfur-containing gas, $SO_2$, is used as the etching gas to selectively etch the diffusion prevention film (SiC) against the low-k film (SiOC). In this embodiment, $SO_3$, $SOF_2$, $SO_2F_2$, $SON_x$, $SON_xF_y$, or $SH_2$ can be used instead of $SO_2$. This is because these gases and radicals generated from them protect the low-k film (SiOC).

Figure 4:
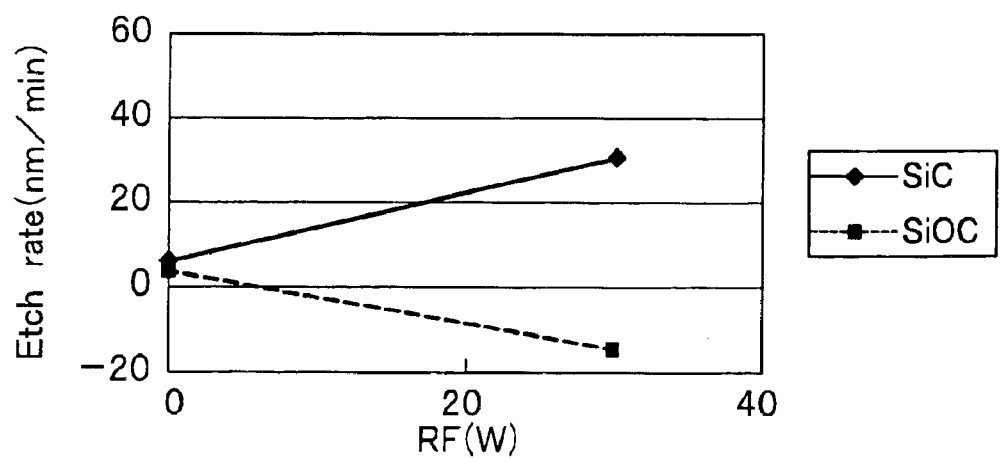
FIG. 4 is a graph showing the protecting properties of $SO_2$ gas and the etching selectivity of SiC to SiOC.

FIG. 4 shows the etching properties obtained from the example in which $SO_2$ is used. In this FIG. 4, results obtained by performing the etching using the apparatus of FIG. 1 at power of 800 W of microwave and at a flow rate of 50 sccm of $SO_2$. In this FIG. 4, the horizontal axis indicates the power of radio frequency applied across the electrodes, and the vertical axis indicates the etching rates of SiC and SiOC.

When RF=0, the etching rates of SiC and SiOC are both nearly 0; however, when RF is increased, the etching rate of SiC increases. On the contrary, the etching rate of SiOC decreases and becomes negative values. In this occasion, since reaction products are stacked on SiOC, the etching selectivity of SiC outwardly becomes higher than SiOC.

These results verify the validity of the evaluation of the protecting properties using the indicator ΔE based on the binding energies. As shown in FIG. 4, since the etching rate of SiC is not zero (0) even if RF=zero (0), this means that reaction is "chemical etching" which is the etching by a radical only. Additionally, since SiC is selectively etched against SiO, the prediction of the selectivity of the etching can be assumed based on the amount of the binding energy.

According to the first example, when an LSI device including a Cu interconnection and a low-k film (SiOC) undergoes the etching process, either the diffusion prevention film or the etching stop film (SiC) is etched selectively against the low-k film. This is because $SO_2$ which has a high etching rate against SiC and prevents the etching of SiOC is used as the etching gas. Thereby, a high etching selectivity can be realized.

As shown in FIG. 2, the etching gas can be selected from various kinds of gases or the combinations of these gases satisfying the protecting properties for the low-k film and the etching properties against the diffusion prevention film.

EXAMPLE 2

FIG. 5 shows the LSI device structure of a second embodiment. In this LSI device structure, the mask material 21 is made from SiC, the underlying low-k film 18 is made from SiOC, and the resist 22 is made from C, H, O, or the like. In this embodiment, since $SO_2$ is used as the etching gas, the mask 21 is selectively etched against the low-k film 18 and the resist 22. In this case, gases of $SO_3$, SO, $S_2O_3$, $SOF_2$, $SO_2F_2$, $SON_x$, $SON_xF_y$, or $SH_2$ can be used in addition to $SO_2$.

EXAMPLE 3

In this example, a gas of $NF_3$ having high etching properties against the diffusion prevention film is mixed with the etching gas of $SO_2$ in order to improve the etching rate. It is also possible to use $NF_3O$, $N_2F_4$, or $SF_6$ in place of $NF_3$ to be mixed with the etching gas $SO_2$.

In the etching apparatus shown in FIG. 1, as the etching gas, $SO_2$ and $NF_3$ are mixed at a ratio of 1:2 and this mixture gas is supplied from the gas introduction system 2. Here, the power of the microwave is set to 800 W, and the pressure and the RF are used as parameters. In this case, the etching rate of SiC was up to 350 nm/min, and the etching selectivity of SiC to SiOC was 5 to 15.

According to the present example, (1) the improved etching selectivity of the diffusion prevention film against the low-k film and (2) the improved etching rate are obtained, in addition to protecting properties of the low-k film by the etching gas explained in example 1. This combination of the mixed gas can also be applied to the example 2 to obtain similar effects.

EXAMPLE 4

$CO_2$ is added to the mixture gas of the example 3 in an attempt to control the etching selectivity and the processed pattern. Alternatively, CO, $C_3O_2$, or $O_2$ can be used as the additive gas. As can be seen from FIG. 6, these additive gases have superior characteristics following $SO_2$ and $SO_3$ in terms of amount of the binding energy with Si-surface, C-surface, and O-surfaces.

Since these additive gases have strong depositing properties onto SiOC, the protecting properties for SiOC can be improved when using $NF_3$ having high etching properties against SiC, thereby realizing control of the etching selectivity and the processed pattern.

EXAMPLE 5

A nitrogen (N)-containing gas is added to the mixture gas of the example 3 in an attempt to control the processed pattern. To be more precise, gasses, such as $N_2$, $NH_3$, $NO_x$ ($NO_2$, $N_2O$) or the like, each of which generates $N_2$, $N_2O$, or N in the reaction with radicals, wafer, or walls. These additive gases generate reaction products, which have a negative binding energy, and can control the amount of a product that is difficult to adhere. Therefore, these additive gasses are used as the gas to control the processed pattern.

EXAMPLE 6

A gas which easily etches trenches and holes perpendicularly is added to the mixture gas of the example 3. In order to process trenches and holes perpendicularly by etching, it is possible to select a gas which has a negative binding energy with the surface, and which generates a product difficult to adhere to the respective side walls of the trenches and holes. As shown in FIG. 2, a gas containing hydrogen (H) and halogen, such as HCl, HBr, HF, HI, $CHF_3$, or $CH_2F_2$ is mixed with the mixture gas.

EXAMPLE 7

A gas for changing protecting properties, etching properties, and pattern controlling properties is added to the mixture gas of the example 3. For controlling these properties, it is necessary to change the chemical etching condition, ion properties, and adhering properties, when performing the etching. For this purpose, the ratio of the radical to the ion, and the composition of the radical are changed. To be more specific, a rare gas such as He, Ne, Ar, or Xe is added to the aforementioned mixture gas. This can change the density and temperature of plasma, the degree of dissociation and the composition ratio of the radial to the ion.

EXAMPLE 8

A gas for controlling the protecting properties for the low-k film and the etching properties against the diffusion prevention film is added to the mixture gas of the example 3. As this gas, fluorocarbon $C_xF_y$ consisting of C and F is used. In order to improve the protecting properties, the ratio of x to y cannot be less than 1 ($1 \leq x/y$). In order to improve the etching properties, the ratio of x to y cannot be less than 0.5 ($0.5 \leq x/y$), therefore it is effective to use a gas such as $CF_4$, $C_2F_6$, $C_3F_8$, $C_4F_8$, $C_5F_8$, $C_4F_6$, or $C_6F_6$.

EXAMPLE 9

In the example 4 to example 8, in an attempt to change the adhesion rate of the radicals or reaction products, the temperature of the support table 5, which is used for supporting the wafer 4, is controlled by the temperature control means 19. The temperature can be set in a range of −40 to 100° C. to change the amount of deposition onto SiOC or the amount of deposition and chemical etching against the side walls of SiC, thereby controlling the etching selectivity or the pattern. For example, when a mixture gas of $SO_2$ and $NF_3$ is used, the electrode temperature can be set to 40 to 60° C. to realize a perpendicular pattern.

What is claimed is:

1. An LSI device etching method for subjecting an LSI device to a plasma etching, the LSI device including Cu interconnection and a low-k film, the LSI device being provided with a diffusion prevention film containing silicon (Si) for preventing diffusion of Cu into the low-k film, the LSI device etching method comprising the step of:
   selectively etching the diffusion prevention film against the low-k film, by use of a gas containing sulfur (S) as an etching gas.

2. The LSI device etching process as set forth in claim 1, wherein said etching gas is selected from $SO_2$, $SO_3$, $SOF_2$, $SO_2F_2$, $SON_x$, $SON_xF_y$, and $SH_2$.

3. An LSI device etching method for subjecting an LSI device to a plasma etching, the LSI device including a silicon (Si)-containing mask material and any of an underlying low-k film and a resist, the LSI device etching method comprising the step of:
   selectively etching the mask material against any of the underlying low-k film and the resist, by use of a gas containing sulfur (S) as an etching gas.

4. The LSI device etching process as set forth in claim 1, wherein a gas containing nitrogen (N) and fluorine (F) is mixed with said etching gas.

5. The LSI device etching process as set forth in claim 4, wherein said gas containing nitrogen (N) and fluorine (F) is selected from $NF_3$, $NF_3O$ and $N_2F_4$.

6. The LSI device etching process as set forth in claim 4, wherein a gas containing carbon (C) is added to said etching gas.

7. The LSI device etching process as set forth in claim 4, wherein $N_2$, $NH_3$, or $NO_x$ is added to said etching gas.

8. The LSI device etching process as set forth in claim 4, wherein a gas containing hydrogen (H) and halogen is added to said etching gas.

9. The LSI device etching process as set forth in claim 4, wherein fluorocarbon $C_xF_y$ containing carbon (C) and fluorine (F) is added to said etching gas.

10. The LSI device etching process as set forth in claim 4, wherein a rare gas is added as a carrier gas into said etching gas.

11. An LSI device etching method for subjecting an LSI device to a plasma etching, the LSI device having a damascene structure including Cu interconnection, a SiCO low-k film and a SiC diffusion prevention film, the LSI device etching method comprising the step of:
   selectively etching the diffusion prevention film against the low-k film, by use of a mixture of $SO_2$ and $NF_3$ as an etching gas.

12. An LSI device etching apparatus for subjecting an LSI device to a plasma etching, the LSI device including Cu interconnection, a low-k film and a diffusion prevention film, said LSI device etching apparatus comprising:
   a plasma treatment apparatus which changes an etching gas into plasma and applies high frequency power to an electrode to thereby etch the LSI device by utilizing ions in the plasma, said plasma treatment apparatus having a treatment chamber being provided with a support table in which said electrode is provided and on which the LSI device is to be placed, the etching gas being introduced into said treatment chamber,
   wherein a mixture of a sulfur (S)-containing gas and a nitrogen (N)-and-fluorine (F)-containing gas is used as the etching gas in the step of selectively etching the diffusion prevention film against the low-k film.

13. The LSI device etching apparatus as set forth in claim 12, wherein said plasma treatment apparatus is equipped with a temperature control means for changing the temperature of said support table in an attempt to change an adhesion rate of a radial and reaction product.

* * * * *